(12) United States Patent
Kim et al.

(10) Patent No.: US 12,736,630 B2
(45) Date of Patent: Sep. 15, 2026

(54) SPATIAL LIGHT MODULATOR, LiDAR APPARATUS INCLUDING THE SAME, AND METHOD OF MANUFACTURING THE SPATIAL LIGHT MODULATOR

(71) Applicant: SAMSUNG ELECTRONICS CO., LTD., Suwon-si (KR)

(72) Inventors: Sunil Kim, Osan-si (KR); Junghyun Park, Seoul (KR); Duhyun Lee, Yongin-si (KR); Byunggil Jeong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1302 days.

(21) Appl. No.: 17/502,885

(22) Filed: Oct. 15, 2021

(65) Prior Publication Data

US 2022/0171027 A1 Jun. 2, 2022

(30) Foreign Application Priority Data

Nov. 27, 2020 (KR) ........................ 10-2020-0163349
Feb. 25, 2021 (KR) ........................ 10-2021-0025993

(51) Int. Cl.
*H10H 20/81* (2025.01)
*G01S 7/481* (2006.01)
(Continued)

(52) U.S. Cl.
CPC .......... *G01S 7/4814* (2013.01); *G01S 7/4865* (2013.01); *G01S 17/931* (2020.01); *H10H 20/81* (2025.01)

(58) Field of Classification Search
CPC ...... H10H 20/841; H01L 25/167; G01S 17/08
See application file for complete search history.

(56) References Cited

U.S. PATENT DOCUMENTS 5,594,567 A 1/1997 Akiyama et al.
8,948,223 B2 2/2015 Chung
(Continued)

FOREIGN PATENT DOCUMENTS

CN 1360376 A * 7/2002 ......... H01S 5/18394
CN 116762027 A * 9/2023
(Continued)

OTHER PUBLICATIONS

Rongqing Hui, Chapter 4—Photodetectors, Editor(s): Rongqing Hui, Introduction to Fiber-Optic Communications, Academic Press, pp. 125-154, ISBN 9780128053454, https://doi.org/10.1016/B978-0-12-805345-4.00004-4. (https://www.sciencedirect.com/science/article/pii/B9780128053454000044) (Year: 2019).*

(Continued)

*Primary Examiner* — William B Partridge
*Assistant Examiner* — Felix B Andrews
(74) *Attorney, Agent, or Firm* — Sughrue Mion, PLLC

(57) ABSTRACT

Provided is a light modulator including a first reflective layer, a cavity layer provided on the first reflective layer, and a second reflective layer provided on the cavity layer opposite to the first reflective layer, the second reflective layer including a plurality of lattice structures, wherein each lattice structure of the plurality of lattice structures have a pin diode structure and includes a p-type semiconductor layer, an intrinsic semiconductor layer, and an n-type semiconductor layer, and wherein a thickness of the p-type semiconductor layer and a thickness the n-type semiconductor layer are in a range from 8% to 16% of a thickness of the intrinsic semiconductor layer.

27 Claims, 10 Drawing Sheets

(51) Int. Cl.
*G01S 7/4865* (2020.01)
*G01S 17/931* (2020.01)

(56) References Cited

U.S. PATENT DOCUMENTS

| | | | | |
|---|---|---|---|---|
| 2004/0028092 | A1* | 2/2004 | Kim | B82Y 10/00 372/20 |
| 2007/0114626 | A1* | 5/2007 | Kang | H10F 39/802 257/431 |
| 2007/0284688 | A1* | 12/2007 | Lagally | H10F 77/122 257/458 |
| 2011/0233507 | A1* | 9/2011 | Sonehara | H10B 61/20 257/E21.003 |
| 2014/0233013 | A1* | 8/2014 | Sakimura | G01S 7/4815 356/5.01 |
| 2016/0020582 | A1* | 1/2016 | Ma | H01S 5/187 359/359 |
| 2017/0214218 | A1* | 7/2017 | Tan | H01S 5/0267 |
| 2020/0132542 | A1* | 4/2020 | Jou | G02B 6/4206 |
| 2020/0183148 | A1 | 6/2020 | Park et al. | |
| 2021/0126161 | A1* | 4/2021 | Monavarian | H01S 5/18361 |
| 2021/0377498 | A1* | 12/2021 | Ishikawa | H04N 25/136 |
| 2022/0381885 | A1* | 12/2022 | Ruck | G01S 7/4868 |

FOREIGN PATENT DOCUMENTS

| | | | | |
|---|---|---|---|---|
| JP | 6-43482 A | | 2/1994 | |
| JP | 2019-174538 A | | 10/2019 | |
| KR | 20060091509 A | * | 8/2006 | H01S 5/34 |
| KR | 10-2010-0111543 A | | 10/2010 | |
| KR | 10-2014-0057536 A | | 5/2014 | |
| KR | 10-1809313 B1 | | 1/2018 | |
| KR | 10-2019-0096624 A | | 8/2019 | |
| KR | 10-2020-0071909 A | | 6/2020 | |
| WO | WO-03089984 A1 | * | 10/2003 | G02F 1/3136 |

OTHER PUBLICATIONS

Communication dated Nov. 18, 2024, issued by the Korean Intellectual Property Office in Korean Application No. 10-2021-0025993.

* cited by examiner

SPATIAL LIGHT MODULATOR, LiDAR APPARATUS INCLUDING THE SAME, AND METHOD OF MANUFACTURING THE SPATIAL LIGHT MODULATOR

CROSS-REFERENCE TO RELATED APPLICATIONS

This application is based on and claims priority under 35 U.S.C. § 119 to Korean Patent Application No. 10-2020-0163349, filed on Nov. 27, 2020 and Korean Patent Application No. 10-2021-0025993, filed on Feb. 25, 2021, in the Korean Intellectual Property Office, the disclosures of which are incorporated by reference herein in their entireties.

BACKGROUND

1. Field

The present disclosure relates to spatial light modulators capable of controlling a phase of emission light, LiDAR apparatuses including the spatial light modulators, and methods of manufacturing the spatial light modulators.

2. Description of Related Art

Advanced driving assistance systems (ADASs) having various functions have been commercialized. For example, an increasing number of vehicles are equipped with functions such as an adaptive cruise control (ACC), which reduces the speed of a vehicle if there is a risk of collision and the vehicle is driven within a set speed range if there is no risk of collision by recognizing a location and speed of another vehicle, and an autonomous emergency braking system (AEB), which automatically applies braking to prevent collisions when there is a risk of collision by recognizing the vehicle in front when the driver does not respond to the risk of collision or the response method is inappropriate. In addition, it is expected that cars capable of autonomous driving will be commercialized in the near future.

Accordingly, there is a growing interest in optical measurement devices capable of providing information around a vehicle. For example, a light detection and ranging (LiDAR) apparatus may provide information such as a distance to an object around a vehicle, a relative speed, and an azimuth by radiating a laser to a selected area around a vehicle and detecting a reflected laser. To this end, the LiDAR apparatus requires a beam steering technique capable of steering light to a desired area.

Beam steering methods are largely divided into mechanical methods and non-mechanical methods. The mechanical beam steering methods include, for example, a method of rotating a light source itself, a method of rotating a mirror that reflects light, a method of moving a spherical lens in a direction perpendicular to an optical axis, and the like. In addition, the non-mechanical beam steering methods include, for example, a method of using a semiconductor device and a method of electrically controlling an angle of reflected light by using a reflective phased array.

SUMMARY

One or more example embodiments provide spatial light modulators having high reliability, light detection and ranging (LiDAR) apparatuses including the spatial light modulators, and methods of manufacturing the spatial light modulators.

Additional aspects will be set forth in part in the description which follows and, in part, will be apparent from the description, or may be learned by practice of example embodiments.

According to an aspect of an example embodiment, there is provided a light modulator including a first reflective layer, a cavity layer provided on the first reflective layer, and a second reflective layer provided on the cavity layer opposite to the first reflective layer, the second reflective layer including a plurality of lattice structures, wherein each lattice structure of the plurality of lattice structures have a pin diode structure and includes a p-type semiconductor layer, an intrinsic semiconductor layer, and an n-type semiconductor layer, and wherein a thickness of the p-type semiconductor layer and a thickness the n-type semiconductor layer are in a range from 8% to 16% of a thickness of the intrinsic semiconductor layer.

A thickness of each lattice structure of the plurality of lattice structures may be in a range from 500 nm to 700 nm.

A width of each of the plurality of lattice structures may be in a range from 300 nm to 400 nm.

The intrinsic semiconductor layer may include silicon.

The p-type semiconductor layer may include silicon doped with phosphorous or arsenic.

The n-type semiconductor layer may include silicon doped with boron.

A doping concentration of the p-type semiconductor layer and a doping concentration of the n-type semiconductor layer may range from $10^{15}$ $cm^{-3}$ to $10^{21}$ $cm^{-3}$.

A reflectivity of the second reflective layer may be less than a reflectivity of the first reflective layer.

The second reflective layer may include a dielectric provided between the plurality of lattice structures.

The first reflective layer may be a distributed Bragg reflector.

According to another aspect of an example embodiment, there is provided a light modulator including a first reflective layer, a cavity layer provided on the first reflective layer, and a second reflective layer provided on the cavity layer opposite to the first reflective layer, the second reflective layer, the second reflective layer including a plurality of lattice structures, wherein each lattice structure of the plurality of lattice structures have a pin diode structure and includes a p-type semiconductor layer, an intrinsic semiconductor layer, and an n-type semiconductor layer, wherein a thickness of each lattice structure of the plurality of lattice structures is in a range from 500 nm to 700 nm, and wherein a thickness of the p-type semiconductor layer and a thickness of the n-type semiconductor is in a range from 35 nm to 90 nm.

A thickness of the p-type semiconductor layer and a thickness of the n-type semiconductor layer may be in a range from 45 nm to 70 nm.

A width of each lattice structure of the plurality of lattice structures may be in a range from 300 nm to 400 nm.

The intrinsic semiconductor layer may include silicon.

The p-type semiconductor layer may include silicon doped with phosphorous or arsenic.

The n-type semiconductor layer may include silicon doped with boron.

A doping concentration of the p-type semiconductor layer and a doping concentration of the n-type semiconductor layer may range from $10^{15}$ $cm^{-3}$ to $10^{21}$ $cm^{-3}$.

A reflectivity of the second reflective layer may be less than a reflectivity of the first reflective layer.

The second reflective layer may include a dielectric provided between the plurality of lattice structures.

According to yet another aspect of an example embodiment, there is provided a light detection and ranging (LiDAR) apparatus including a light source configured to emit light, a light modulator configured to radiate light to an object based on controlling a traveling direction of the light emitted from the light source, and a photodetector configured to detect light reflected from the object, wherein the light modulator includes a first reflective layer, a cavity layer provided on the first reflective layer, and a second reflective layer provided on the cavity layer opposite to the first reflective layer, the second reflective layer including a plurality of lattice structures, wherein each lattice structure of the plurality of lattice structures have a pin diode structure and includes a p-type semiconductor layer, an intrinsic semiconductor layer, and an n-type semiconductor layer, wherein a thickness of each lattice structure of the plurality of lattice structures is in a range from 500 nm to 700 nm, and wherein a thickness of the p-type semiconductor layer and a thickness of the n-type semiconductor layer are in a range from 35 nm to 90 nm.

A width of each lattice structure of the plurality of lattice structures may be in a range from 300 nm to 400 nm.

The intrinsic semiconductor layer may include silicon.

The p-type semiconductor layer may include silicon doped with phosphorous or arsenide.

The n-type semiconductor layer may include silicon doped with boron.

A doping concentration of the p-type semiconductor layer and a doping concentration of the n-type semiconductor layer may range from $10^{15}$ $cm^{-3}$ to $10^{21}$ $cm^{-3}$.

A reflectivity of the second reflective layer may be less than a reflectivity of the first reflective layer.

The second reflective layer may include a dielectric provided between the plurality of lattice structures.

The first reflective layer may be a distributed Bragg reflector.

According to yet another aspect of an example embodiment, there is provided a method of manufacturing a light modulator, the method including providing a first reflective layer, providing a cavity layer on the first reflective layer, and providing a second reflective layer on the cavity layer, the second reflective layer including a plurality of lattice structures, wherein each lattice structure of the plurality of lattice structures have a pin diode structure and includes a p-type semiconductor layer, an intrinsic semiconductor layer, and an n-type semiconductor layer, and wherein a thickness of the p-type semiconductor layer and a thickness of the n-type semiconductor layer are in a range from 8% to 16% of the thickness of the intrinsic semiconductor layer.

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1A:
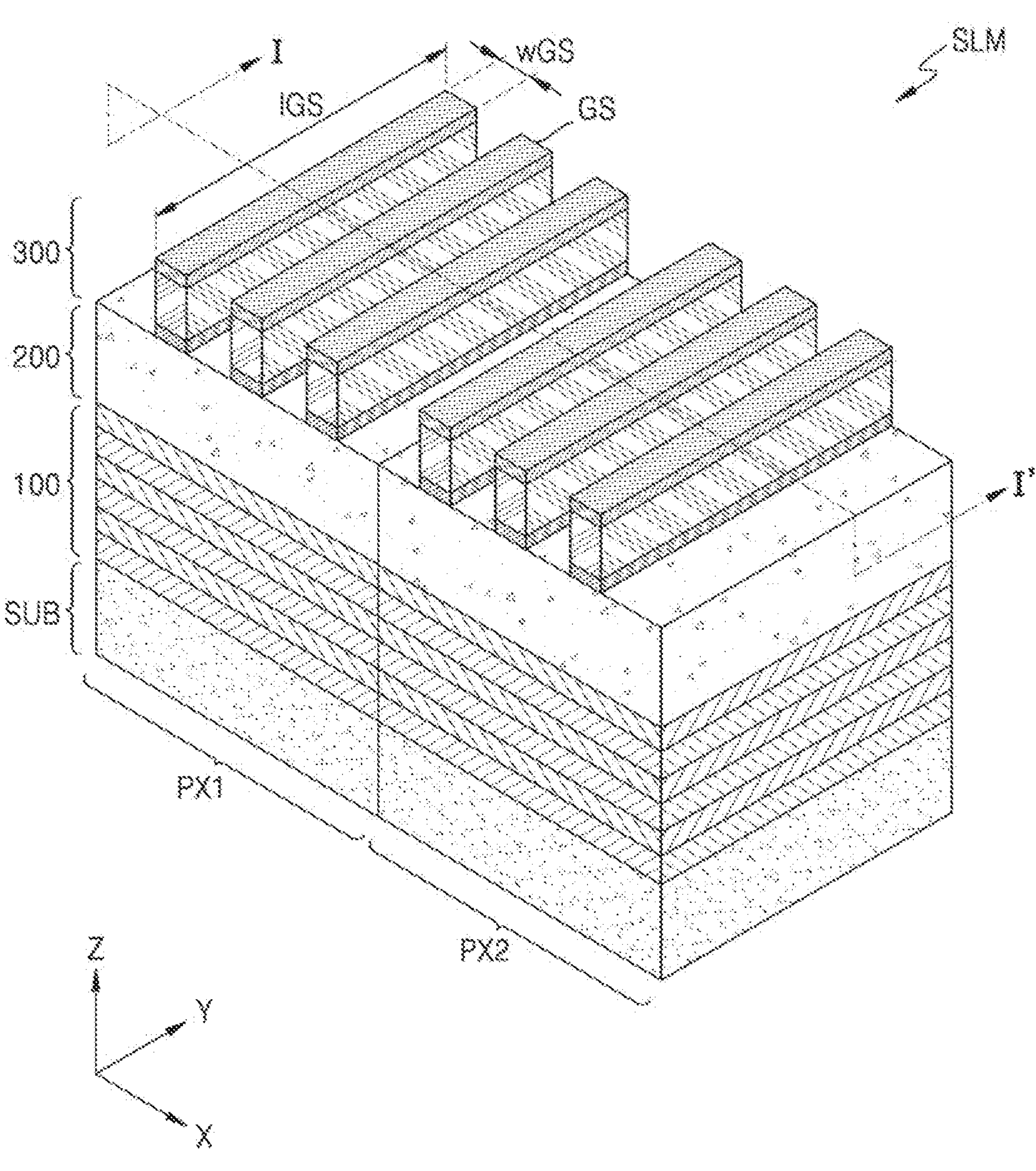
FIG. 1A is a perspective view conceptually illustrating a spatial light modulator according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a spatial light modulator according to various example embodiments will be described in detail with reference to the accompanying drawings. The same reference numerals in the following figures refer to the same components, and the size of each component on the figures may be exaggerated for a description of the description. It will be understood that, although the terms "first", "second", etc. may be used herein to describe various elements, these elements should not be limited by these terms. These terms are only used to distinguish one element from another.

The singular forms include the plural forms unless the context clearly indicates otherwise. It should be understood that, when a part "comprises" or "includes" an element in the specification, unless otherwise defined, it is not excluding other elements but may further include other elements. In the drawing, the size or thickness of each component may be exaggerated for clarity of descriptions. Further, when it is said that a predetermined material layer is on a substrate or another layer, the material layer may be present in direct contact with the substrate or other layer, and there may be a third layer therebetween. Also, in the following example embodiments, a material included in each layer is an example, thus, the layer may include other materials.

Also, in the specification, the term "units" or ". . . modules" denote units or modules that process at least one function or operation, and may be realized by hardware, software, or a combination of hardware and software.

Specific executions described in the present disclosure are example embodiments and do not limit the technical scope of the present disclosure in any method. For the simplicity of the specification, descriptions of electronic configurations of the related art, control systems, software, and other functional aspects may be omitted. Also, the connections of lines and connection members between constituent elements depicted in the drawings are examples of functional connection and/or physical or circuitry connections, and thus, in practical devices, may be expressed as replaceable or additional functional connections, physical connections, or circuitry connections.

The term "above" and similar directional terms may be applied to both singular and plural.

Operations of all methods described herein may be performed in any suitable order unless otherwise indicated herein or otherwise clearly contradicted by context. The use of any and all examples, or exemplary language (e.g., "such as") provided herein, is intended merely to better illuminate the inventive concept and does not pose a limitation on the scope unless otherwise claimed.

Figure 1B:
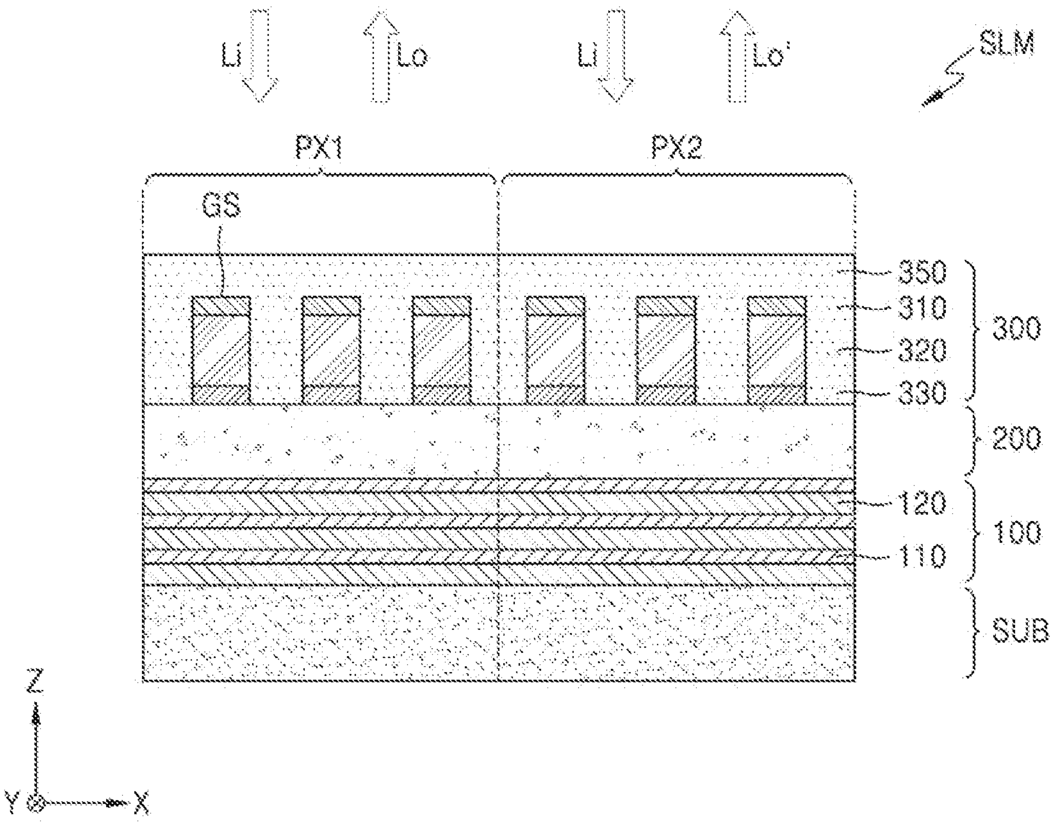
FIG. 1B is a cross-sectional view taken along line I-I' in FIG. 1A.
Figure 2:
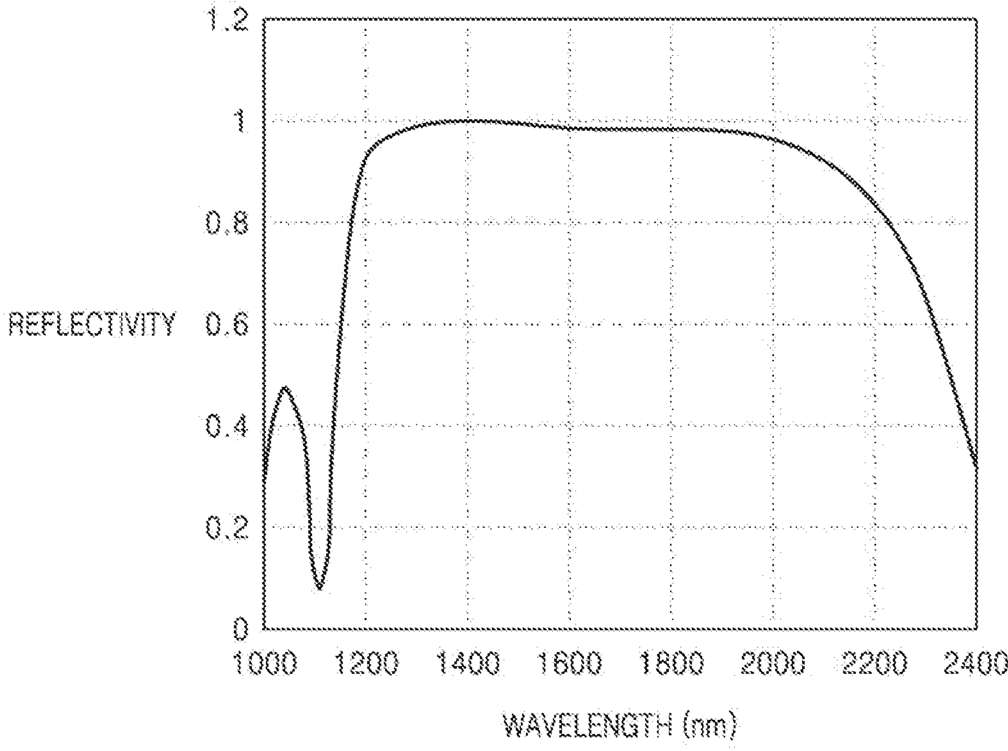
FIG. 2 is a graph illustrating the reflectivity of a first reflective layer of FIG. 1A.

FIG. 1A is a perspective view conceptually illustrating a spatial light modulator according to an example embodiment, FIG. 1B is a cross-sectional view taken along line I-I' in FIG. 1A, and FIG. 2 is a graph showing a reflective spectrum of the first reflective layer of FIG. 1A.

Referring to FIGS. 1A and 1B, a spatial light modulator SLM may include a cavity layer 200 between a first reflective layer 100 and a second reflective layer 300.

The spatial light modulator SLM may output light by modulating a phase of incident light Li. The spatial light modulator SLM may include a plurality of pixels. The plurality of pixels may include, for example, a first pixel PX1 and a second pixel PX2. A pixel may be the smallest unit independently driven by the spatial light modulator SLM or a basic unit capable of independently modulating a phase of light. The pixel may include one or a plurality of lattice structures GS that are included in the second reflective layer 300. FIGS. 1A and 1B illustrate a structure including two pixels as an example. However, embodiments are not limited thereto. A length lGS of one side of the first pixel PS1 and the second pixel PX2 may be, for example, in a range from about 3 μm to about 300 μm.

The spatial light modulator SLM may further include a substrate SUB supporting the first reflective layer 100. The substrate SUB may include a transparent substrate SUB that transmits light such as, for example, a silicon substrate or a glass substrate. The substrate SUB is an optional configuration, and thus, may be removed as needed.

The first reflective layer 100 may be a distributed Bragg reflector. For example, referring to FIG. 1B, the first reflective layer 100 may include a first layer 110 and a second layer 120 having different refractive indices from each other. The first layer 110 and the second layer 120 may be alternately and repeatedly stacked. Due to a difference in refractive index between the first layer 110 and the second layer 120, light may be reflected at an interface of each layer, and the reflected light may cause interference. The first layer 110 or the second layer 120 may include silicon (Si), silicon nitride ($Si_3N_4$), silicon oxide ($SiO_2$), or titanium oxide ($TiO_2$). For example, the first layer 110 may include a silicon (Si) layer, and the second layer 120 may include silicon oxide ($SiO_2$). The light reflectivity of the first reflective layer 100 may be set by controlling thickness and/or the number of stacks of the first layer 110 and the second layer 120.

The first reflective layer 100 may have a structure other than the distributed Bragg reflector, and may include, for example, a metal reflector, a surface of which is a metal.

FIG. 2 is a graph showing a reflectivity of the first reflective layer 100 of FIG. 1A. FIG. 2 shows a reflection spectrum in the case when the first reflective layer 100 is a distributed Bragg reflector, that is, a reflectivity in the vertical axis according to a wavelength in the horizontal axis of light.

The reflection spectrum of FIG. 2 is measured in a distributed Bragg reflector having a structure in which the first layer 110 includes silicon (Si) having a thickness of 110 nm, the second layer 120 includes silicon oxide ($SiO_2$) having a thickness of 265 nm, and the first and second layers 110 and 120 are alternately stacked three times. Referring to FIG. 2, the first reflective layer 100 shows a high reflectivity close to 1 in a wavelength range from about 1400 nm to about 1800 nm.

Referring back to FIG. 1A, the cavity layer 200 is a region in which incident light resonates and may be arranged between the first reflective layer 100 and the second reflective layer 300.

The cavity layer 200 may include, for example, silicon oxide ($SiO_2$). A resonance wavelength may be determined according to the thickness of the cavity layer 200. As the thickness of the cavity layer 200 increases, the resonance wavelength of light may be increased, and as the thickness of the cavity layer 200 decreases, the resonance wavelength of light may be reduced.

The second reflective layer 300 may be a grating reflector including a plurality of lattice structures GS separated and spaced apart from each other at a predetermined interval. The lattice structure GS may include a PIN diode. The reflectivity of the second reflective layer 300 may be different from a reflectivity of the first reflective layer 100. For example, the reflectivity of the second reflective layer 300 may be less than the reflectivity of the first reflective layer 100.

The lattice structure GS may have a refractive index greater than a refractive index of a peripheral material. For example, the lattice structure GS may include a silicon-based semiconductor, and a dielectric 350 filled between the lattice structures GS may include a material having a refractive index less than the refractive index of the lattice structure GS, for example, silicon oxide ($SiO_2$). The dielectric 350 may include the same material as a material included in the cavity layer 200. The structure of the second reflective layer 300 will be described in more detail with reference to FIGS. 3A and 3B.

Light Li incident on the spatial light modulator SLM, after passing through the second reflective layer 300 and propagating to the cavity layer 200, is reflected by the distributed Bragg reflector, resonates in the cavity layer 200 by being trapped by the first reflective layer 100 and the second reflective layer 300, and then is emitted through the second reflective layer 300. Emitting lights Lo and Lo' may have a specific phase, and the phase of the emitting lights Lo and Lo' may be controlled by a current supplied to the second reflective layer 300. A travelling direction of light may be determined by a phase relationship of light emitted from adjacent pixels. For example, when the phase of the emitting light Lo of the first pixel PX1 and the phase of the emitting light Lo' of the second pixel PX2 are different from each other, the travelling direction of light may be determined due to an interaction of the emitting lights Lo and Lo'.

Figure 3A:
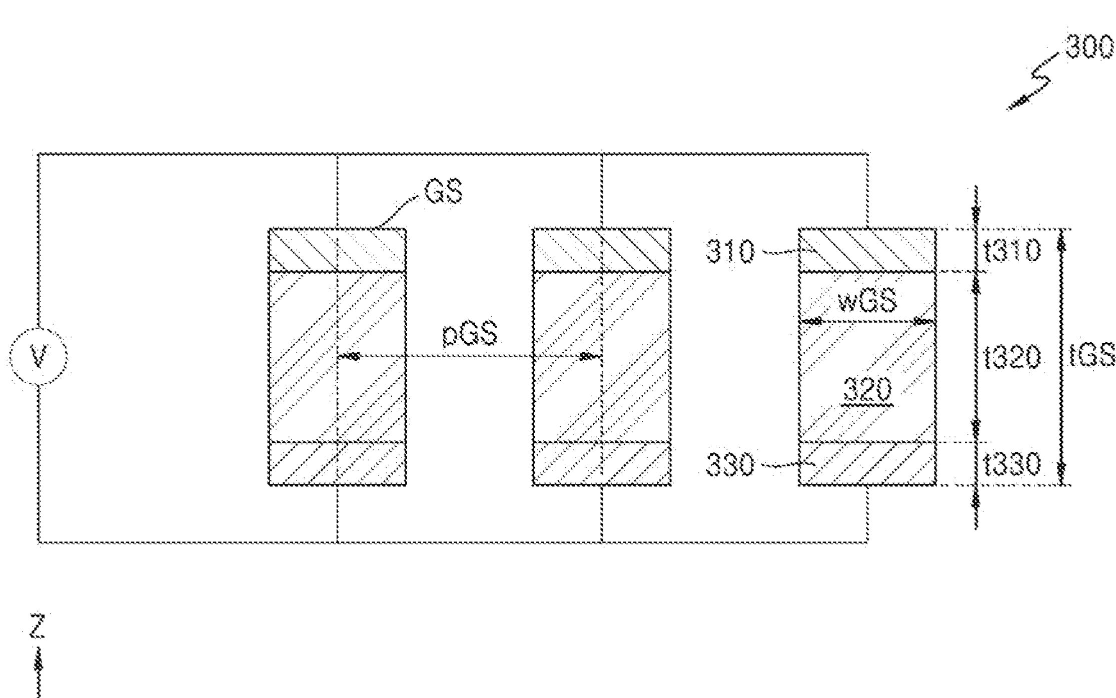
FIG. 3A is a cross-sectional view of a lattice structure included in a first pixel of FIG. 1B.
Figure 3B:
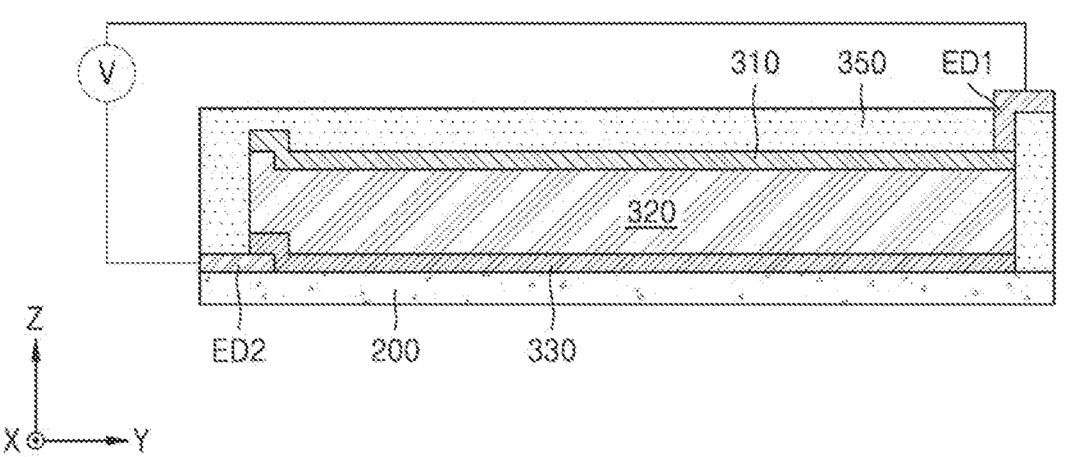
FIG. 3B is a cross-sectional view of a lattice structure cut in another direction.
Figure 3C:
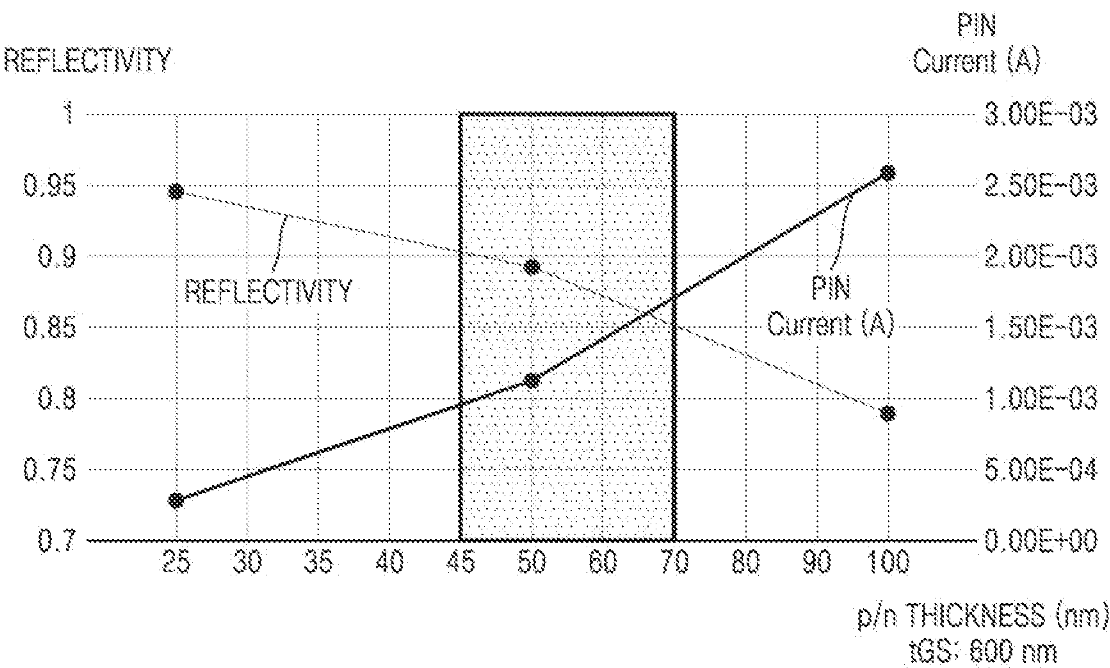
FIG. 3C is a diagram showing reflectivity and magnitude of a current measured while changing a thickness of semiconductor layers included in the lattice structure of FIG. 3A.

FIG. 3A is a cross-sectional view of the lattice structure GS included in the first pixel PX1 of FIG. 1B, FIG. 3B is a cross-sectional view of the lattice structure GS cut in another direction, and FIG. 3C is diagram showing a measured reflectivity and magnitude of current by changing a thickness of semiconductor layers included in the lattice structure GS of FIG. 3A.

Referring to FIG. 3A, each lattice structure GS may be a PIN diode including a p-type semiconductor layer 310, an intrinsic semiconductor layer 320, and an n-type semiconductor layer 330. The p-type semiconductor layer 310 may include a silicon (Si) layer including a Group III element, for example, boron (B) as an impurity. The concentration of the impurity included in the p-type semiconductor layer 310 may be in a range from about $10^{15}/cm^3$ to about $10^{21}/cm^3$. The intrinsic semiconductor layer 320 may include a silicon (Si) layer that does not include an impurity. The n-type semiconductor layer 330 may include a silicon (Si) layer including a Group V element, for example, phosphorus (P) or arsenic (As) as an impurity. The concentration of the impurity included in the n-type semiconductor layer 330 may be in a range from about $10^{15}/cm^3$ to $10^{21}/cm^3$.

FIG. 3A illustrates a structure in which the intrinsic semiconductor layer 320 is arranged above the n-type semiconductor layer 330 and a p-type semiconductor layer 310 is arranged above the intrinsic semiconductor layer, but the p-type semiconductor layer 310 may be arranged under the intrinsic semiconductor layer 320, and the n-type semiconductor layer 330 may be arranged above the intrinsic semiconductor layer 320.

When a voltage is applied between the p-type semiconductor layer 310 and the n-type semiconductor layer 330, a current may flow in a direction from the p-type semiconductor layer 310 to the n-type semiconductor layer 330, and the refractive index of the lattice structure GS may be changed according to a current amount. When the refractive index of the lattice structure GS is changed, a phase of light emitted from the first and second pixels PX1 and PX2 may be changed, and thus, a traveling direction of light emitted from the spatial light modulator SLM may be controlled by adjusting the magnitude of a voltage V applied to each of the first and second pixels PX1 and PX2.

FIG. 3B is a cross-sectional view of a lattice structure GS cut in another direction (Y-direction). Referring to FIG. 3B, the spatial light modulator SLM may include first and second electrodes ED1 and ED2 for applying a voltage to the lattice structure GS. The first electrode ED1 may contact one end of the p-type semiconductor layer 310, and the second electrode ED2 may contact one end of the n-type semiconductor layer 330. The second electrode ED2 may contact an end of the n-type semiconductor layer 330 arranged on an opposite side in the Y-direction to the end of the p-type semiconductor layer 310 to which the first electrode ED1 contacts. The second electrode ED2 may be arranged on the cavity layer 200 and may be a common electrode for applying a common voltage to all pixels included in the spatial light modulator SLM. The first electrode ED1 may be a pixel electrode designed to apply different voltages from each other for each pixel.

The second reflective layer 300 may be designed to appropriately perform a reflection function for reflecting light of a specific wavelength and a phase modulation function for modulating a phase of the emitted light.

FIG. 3C is a diagram showing measured reflectivity and the magnitude of current of the second reflective layer 300 while changing the thicknesses of the p-type semiconductor layer 310 and the n-type semiconductor layer 330 included in the lattice structure GS.

FIG. 3C shows a result of computer simulation when a width wGS of the lattice structure GS is 380 nm, a thickness tGS of the lattice structure GS is 600 nm, a distance between the centers of the lattice structures GS, that is, a lattice pitch pGS is set to 710 nm, and a bias voltage V is 5V.

Referring to the reflectivity graph of FIG. 3C, when the thickness tGS of the lattice structure GS is constant, the reflectivity of the second semiconductor layer 300 decreases as the thicknesses of the p-type and n-type semiconductor layers 310 and 330 increase. For example, in the lattice structure GS having a thickness tGS of 600 nm, when thicknesses t310 and t330 of the p-type and n-type semiconductor layers 310 and 330 respectively are 25 nm, the reflectivity of the second reflective layer 300 is about 0.95, when the thicknesses t310 and t330 of the p-type and n-type semiconductor layers 310 and 330 respectively are 50 nm, the reflectivity of the second reflective layer 300 is decreased to about 0.89, and when the thicknesses t310 and t330 of the p-type and n-type semiconductor layers 310 and 330 respectively are 100 nm, the reflectivity of the second reflective layer 300 is decreased to about 0.79.

Considering that the reflectivity of the second reflective layer 300 should be 0.85 or greater to function as a reflector, the thicknesses t310 and t330 of the p-type and n-type semiconductor layers 310 and 330 may be less than 70 nm. For example, the thicknesses t310 and t330 of the p-type and n-type semiconductor layers 310 and 330 may be less than 16% of a thickness w320 of the intrinsic semiconductor layer 320.

Referring to a current graph of FIG. 3C, when the thickness tGS of the lattice structure GS is constant, as the thicknesses of the p-type and n-type semiconductor layers 310 and 330 increase, a current flowing through the lattice structure GS, that is, a PIN diode increases. For example, when the lattice structure GS has a thickness of 600 nm, if a potential difference of 5V is applied to the p-type and n-type semiconductor layers 310 and 330 and the thicknesses t310 and t330 of the p-type and n-type semiconductor layers 310 and 330 are each 25 nm, a current flowing through the lattice structure GS is about 2.50E−04 A. When the thicknesses t310 and t330 of the p-type and n-type semiconductor layers 310 and 330 are each 50 nm, the current increases to about 1.10E−03 A, and when the thicknesses t310 and t330 of the p-type and n-type semiconductor layers 310 and 330 are each 100 nm, the current increases to about 2.60E−03 A.

Considering that a current should be greater than 1.10E−03 A in order to appropriately control a refractive index of the lattice structure GS including silicon (Si), the thicknesses t310 and t330 of the p-type and n-type semiconductor layers 310 and 330 may be greater than 45 nm. For example, the thicknesses t310 and t330 of the p-type and n-type semiconductor layers 310 and 330 may be greater than 8% of the thickness w320 of the intrinsic semiconductor layer 320.

According to example embodiments, the thicknesses t310 and t330 of the p-type and n-type semiconductor layers 310 and 330 for appropriately performing a reflection function for reflecting light of a specific wavelength and a phase modulation function for modulating a phase of emitting light may be in a range from about 45 nm to about 70 nm, respectively, or may be in a range from about 8% to about 16% of the thickness w320 of the intrinsic semiconductor layer 320.

The reflectivity of the second reflective layer 300 may also be controlled by changing a width wGS, a thickness tGS, and/or a pitch pGS of the lattice structure GS, in addition to the thicknesses t310 and t330 of the p-type and n-type semiconductor layers 310 and 330.

The thickness tGS of the lattice structure GS may be 700 nm or less. When the thickness tGS of the lattice structure GS is greater than 700 nm, a range of wavelength having a reflectivity of 90% or more is reduced, and thus, the lattice structure GS may be difficult to be used as a reflective layer The thickness tGS of the lattice structure GS may also be 500 nm or less. When the thickness tGS of the lattice structure GS is less than 500 nm, the transmittance of the second reflective layer 300 increases, and thus, it may be difficult to secure a reflectivity. When the thickness tGS of the lattice structure GS is about 500 nm, the thicknesses t310 and t330 of the p-type and n-type semiconductor layers 310 and 330 may be in a range from about 35 nm to about 60 nm, and when the thickness tGS of the lattice structure GS is about 700 nm, the thicknesses t310 and t330 of the p-type and n-type semiconductor layers 310 and 330 may be in a range from about 50 nm to about 90 nm. Accordingly, when the thickness tGS of the lattice structure GS is in a range from about 500 nm to about 700 nm, the thicknesses t310 and t330 of the p-type and n-type semiconductor layers 310 and 330 may be in a range from about 35 nm to about 90 nm.

The width wGS of the lattice structure GS may be in a range from about 300 nm to about 400 nm, and the pitch pGS of the lattice structure GS may be in a range from about 500 nm to about 900 nm. The width wGS and the thickness tGS of the lattice structure GS may vary depending on the wavelength of target light.

FIGS. 4A to 4E are diagrams illustrating a method of manufacturing a spatial light modulator SLM according to an example embodiment.

Figure 4A:
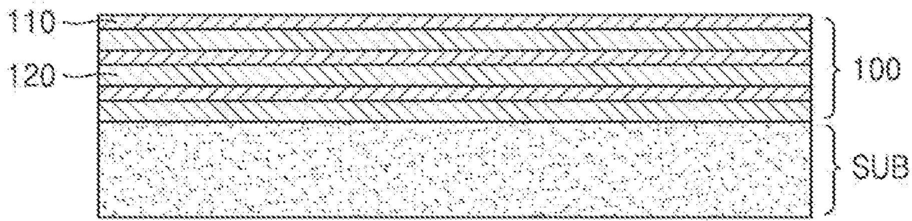
FIGS. 4A, 4B, 4C, 4D, and 4E illustrate a method of manufacturing a spatial light modulator according to an example embodiment.
Figure 4B:
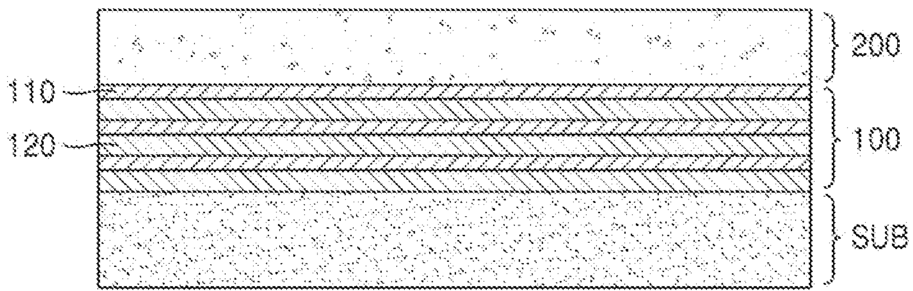

Referring to FIG. 4A, a first reflective layer 100 is formed on a substrate SUB.

The substrate SUB may include a transparent material that transmits light such as, for example, a silicon substrate SUB or a glass substrate SUB.

The first reflective layer 100 may be a distributed Bragg reflector in which first and second layers 110 and 120 having different refractive indices are stacked. The first layer 110 may include, for example, silicon (Si) having a thickness of 110 nm, and the second layer 120 may include, for example, silicon oxide ($SiO_2$) having a thickness of 265 nm. The first reflective layer 100 may be formed by repeatedly forming the first and second layers 110 and 120. The first and second layers 110 and 120 may be formed by using, for example, a chemical vapor deposition (CVD) method Referring to FIG. 4B, a cavity layer 200 is formed on the first reflective layer 100. The cavity layer 200 may include, for example, silicon oxide ($SiO_2$). The thickness of the cavity layer 200 may be in a range from about 300 μm to about 1500 μm, and may be formed by using, for example, a CVD method.

Figure 4C:
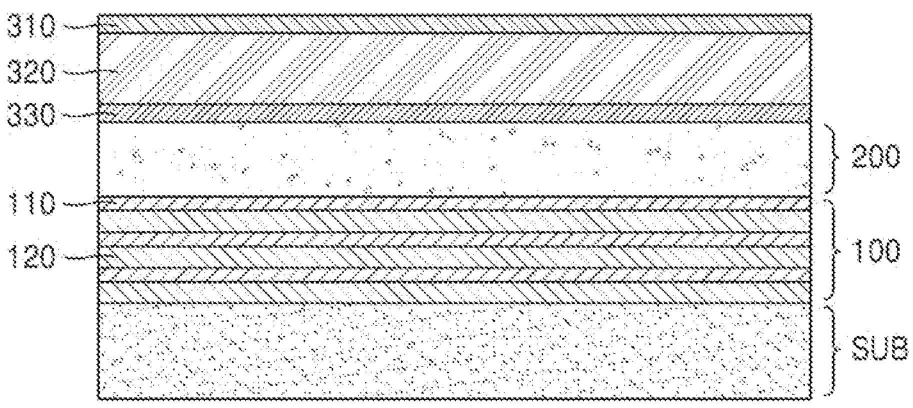
Figure 4D:
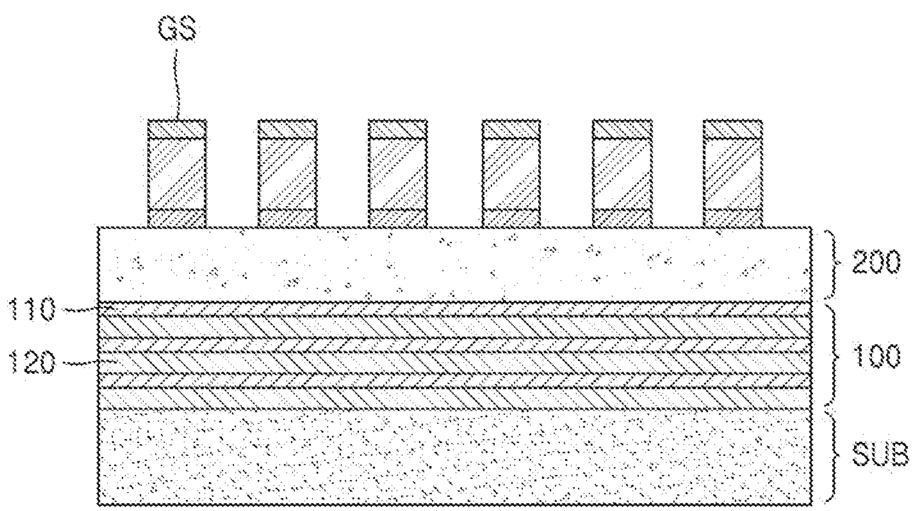
Figure 4E:
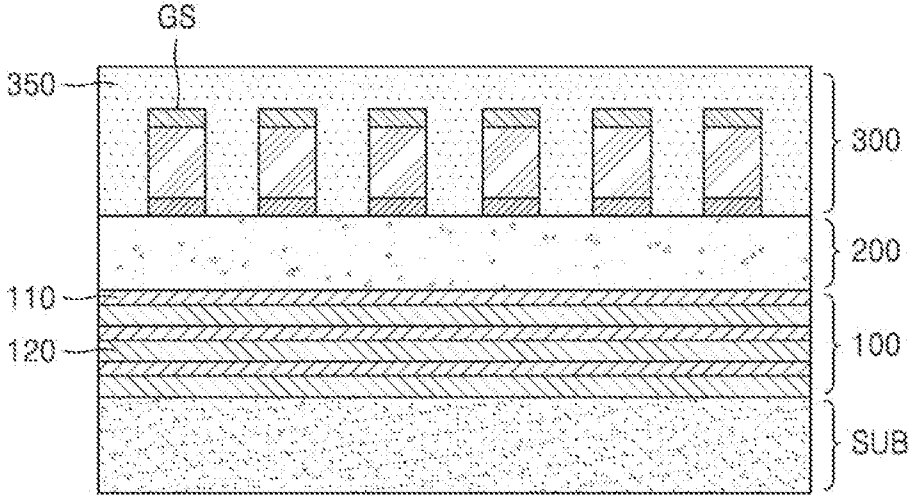

Referring to FIGS. 4C to 4E, a second reflective layer 300 having a plurality of lattice structures GS may be formed on the cavity layer 200.

Referring to FIG. 4C, an n-type semiconductor layer 330, an intrinsic semiconductor layer 320, and a p-type semiconductor layer 310 are sequentially formed on the cavity layer 200. The n-type semiconductor layer 330, the intrinsic semiconductor layer 320, and the p-type semiconductor layer 310 may be formed by using a CVD method.

Referring to FIG. 4D, a plurality of lattice structures GS separated and spaced apart from each other are formed by patterning the n-type semiconductor layer 330, the intrinsic semiconductor layer 320, and the p-type semiconductor layer 310. For example, the plurality of lattice structures GS may be formed by using a photolithography process.

Referring to FIG. 4E, a dielectric 350 may be filled between the lattice structures GS. The dielectric 350 may include a material having a refractive index less than a refractive index of the lattice structure GS, for example, silicon oxide ($SiO_2$).

Thereafter, a heat treatment operation may further be performed on the resultant product. The heat treatment operation may be performed so that silicon (Si) included in the lattice structure GS forms a polycrystalline structure and a height of a part or all grains of the polycrystalline structure becomes the same as the thickness tGS of the lattice structure GS. That is, a crystal size of the lattice structure GS may be increased through the heat treatment so that grains have a columnar shape.

The heat treatment with respect to the lattice structure GS may be performed for a long time at a low temperature. For example, the plurality of lattice structures GS may be heated at a temperature in a range from about 500° C. to about 650° C. for in a range from about 8 hours to about 12 hours. In this way, the lattice structure GS may have a polycrystalline structure having a large crystal size.

After a low-temperature heat treatment, a high-temperature heat treatment may further be performed to heat the lattice structure GS for a short time at a high temperature. The high-temperature heat treatment may be performed at a temperature of 750° C. or higher for 10 minutes or less. The high-temperature heat treatment may be performed at a temperature of 900° C. or less, and may be performed for 1 minute or more. By the high-temperature heat treatment, defects remaining inside the lattice structure GS may be removed, and the degree of crystallinity of the lattice structure GS may further be improved.

The spatial light modulator SML of FIG. 1 may be employed in a beam steering apparatus, such as a three-dimensional (3D) sensor, such as a LiDAR apparatus or a depth sensor used in a 3D camera, and thus, may increase precision of the beam steering apparatus. LiDAR devices may be applied to autonomous vehicles, moving objects, such as drones, mobile devices, small walking means (e.g., bicycles, motorcycles, strollers, boards, etc.), robots, and auxiliary means for humans/animals (e.g., cane, helmet, jewelry, clothing, watches, bags, etc.), Internet of Things (IoT) devices/systems, security devices/systems, etc.

In addition, the spatial light modulator SML of FIG. 1 may be applied to various systems in addition to the LiDAR apparatus. For example, when the spatial light modulator SML is used, 3D information of a space and a subject may be acquired through scanning, and thus, the spatial light modulator SML may be applied to a 3D image acquisition apparatus or a 3D camera. In addition, the spatial light modulator SML may also be applied to a holographic display apparatus and a structured light generating apparatus. In addition, the spatial light modulator SML may be applied to various optical devices, such as a hologram generating apparatus, an optical coupling apparatus, a variable focus lens, and a depth sensor. In addition, the spatial light modulator SML may be used in various fields in which a meta-surface or meta-structure is used. In addition, the spatial light modulator SML and the LiDAR apparatus including the spatial light modulator SML according to an example embodiment may be applied to various optical and electronic fields for various purposes.

Figure 5:
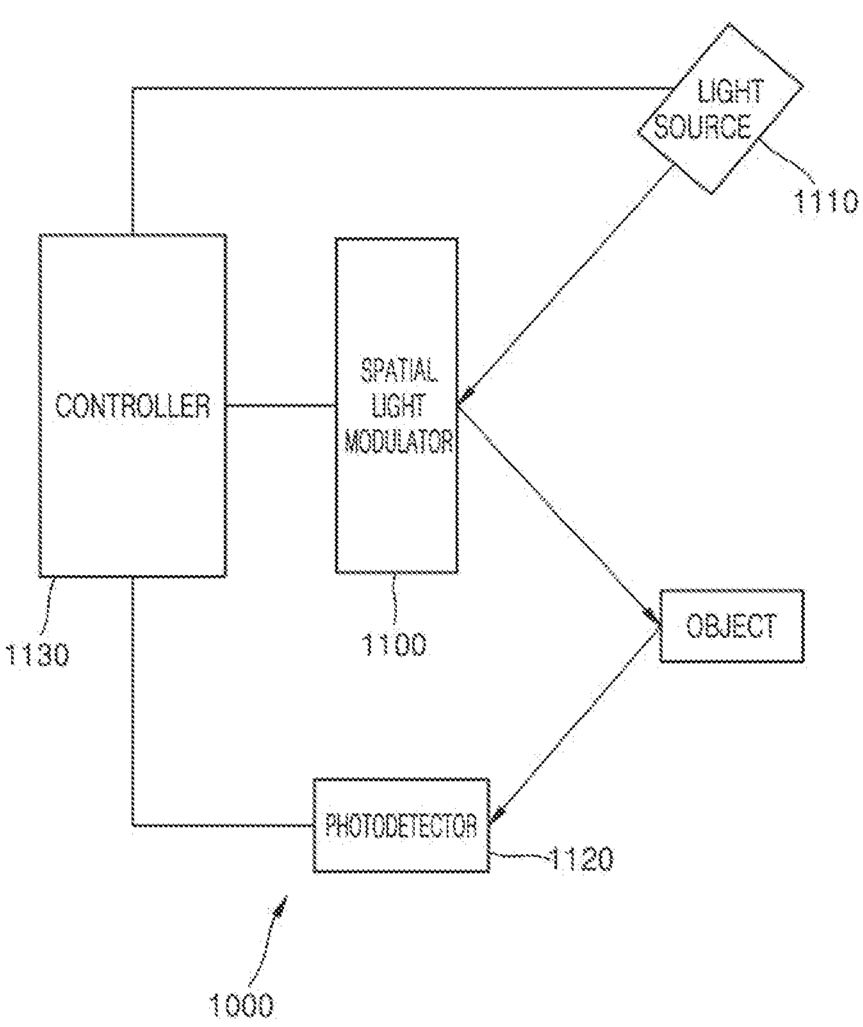
FIG. 5 is a block diagram illustrating a configuration of a LiDAR apparatus according to an example embodiment.

FIG. 5 is a block diagram illustrating a configuration of a LiDAR apparatus 1000 according to an example embodiment.

Referring to FIG. 5, the LiDAR apparatus 1000 according to an example embodiment may include: a light source 1110 configured to radiate light, a spatial light modulator 1100 configured to control a travelling direction of light incident from the light source 1110, a photodetector 1120 configured to detect light that is emitted from the spatial light modulator SML and reflected from an object, and a controller 1130 configured to control the spatial light modulator 1100.

The light source 1110 may include, for example, a light source emitting visible light or a laser diode (LD) or a light-emitting diode (LED) that emits near-infrared rays in a band range of about 800 nm to about 1700 nm.

The spatial light modulator 1100 may include the spatial light modulator SML of FIG. 1A. The spatial light modulator 1100 may control a travelling direction of light by modulating a phase of each pixel. The spatial light modulator 1100 may scan light with a wide viewing angle.

The controller 1130 may control operations of the spatial light modulator 1100, the light source 1110, and the photodetector 1120. For example, the controller 1130 may control on/off operations of the light source 1110 and the photodetector 1120, and a beam scanning operation of the spatial light modulator 1100. Also, the controller 1130 may calculate information on the object based on a measured result of the photodetector 1120.

The LiDAR apparatus 1000 may periodically radiate light to peripheral regions by using the spatial light modulator 1100 to obtain information on objects in a plurality of peripheral positions around the LiDAR apparatus 1000.

Figure 6:
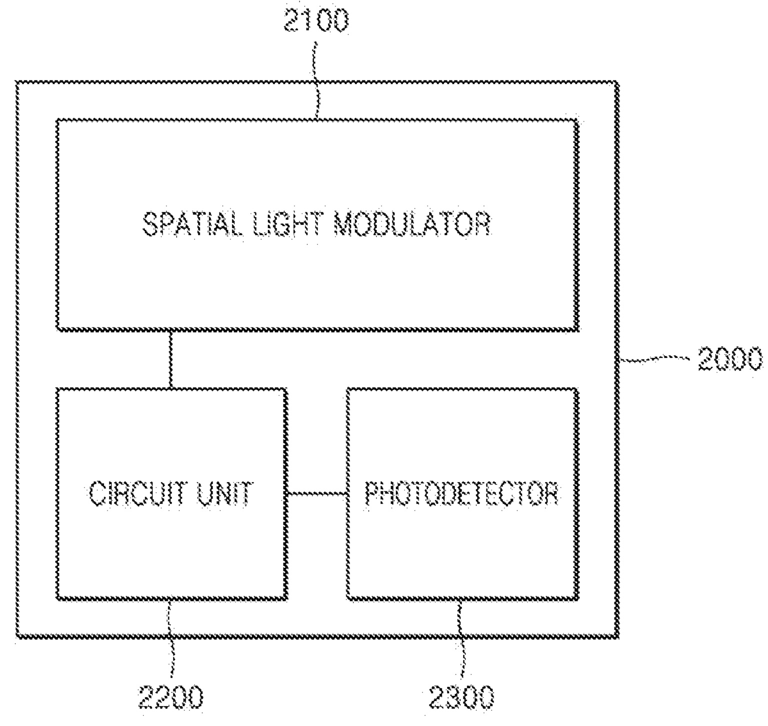
FIG. 6 is a block diagram illustrating a configuration of a LiDAR apparatus according to another example embodiment.

FIG. 6 is a block diagram illustrating a configuration of a LiDAR apparatus 2000 according to another example embodiment.

Referring to FIG. 6, the LiDAR apparatus 2000 may include a spatial light modulator 2100 and a photodetector 2300 for detecting light that is reflected by an object and a traveling direction of which is controlled by the spatial light modulator 2100. The LiDAR apparatus 2000 may further include a circuit unit 2200 connected to the spatial light modulator 2100 and/or the photodetector 2300. The circuit unit 2200 may include a computation unit that obtains and calculates data, and may further include a driving unit and a controller. In addition, the circuit unit 2200 may further include a power supply unit and a memory.

The LiDAR apparatus 2000 in FIG. 6 shows an example in which the spatial light modulator 2100 and the photodetector 2300 are included in a single apparatus, but embodiments are not limited thereto. For example, the spatial light modulator 2100 and the photodetector 2300 may not be provided in the single apparatus, but may be provided in separate apparatuses. The circuit unit 2200 may also not be connected to the spatial light modulator 2100 or the photodetector 2300 by wire, but may be connected through wireless communication.

The LiDAR apparatuses 1000 and 2000 described above may be apparatuses of a phase-shift method or a time-of-flight (TOF) method.

Figure 7:
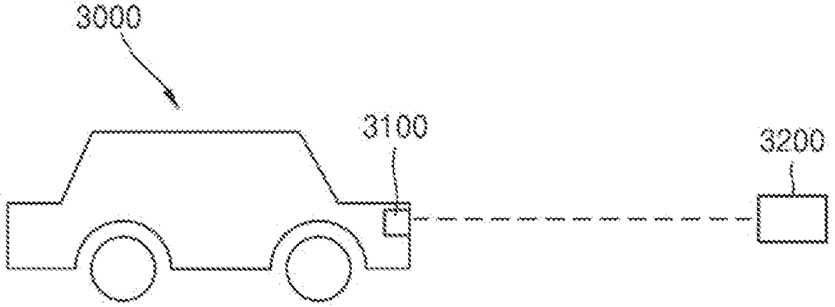
FIGS. 7 and 8 are conceptual diagrams illustrating a LiDAR apparatus according to an example embodiment being applied to a vehicle.
Figure 8:
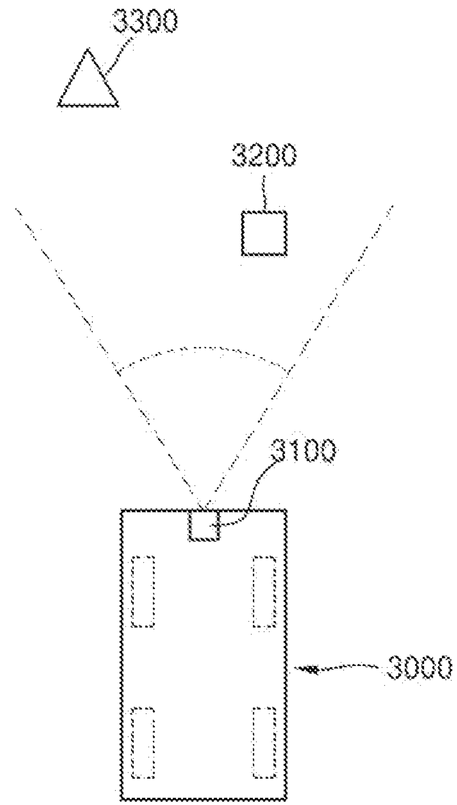

FIGS. 7 and 8 are conceptual diagrams showing an example in which a LiDAR apparatus 3100 is applied to a vehicle 3000. FIG. 7 is a diagram from a side view, and FIG. 8 is a diagram from a top plan view.

Referring to FIG. 7, the LiDAR apparatus 3100 may be applied to the vehicle 3000, and information about an object 3200 may be obtained by using the LiDAR apparatus 3100. The vehicle 3000 may be a car having an autonomous drive function. An object or person, that is, a subject 3200 in a traveling direction of the vehicle 3000 may be detected by using the LiDAR apparatus 3100. In addition, a distance to the subject 3200 may be measured using information, such as a time difference between a transmission signal and a detected signal. As shown in FIG. 8, information about a nearby subject 3200 and a distant subject 3300 within a scan range may also be obtained.

At least one of the components, elements, modules or units (collectively "components" in this paragraph) represented by a block in the drawings, such as the controller 1130 and/or the photodetector in FIG. 5, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

The reflector of the spatial light modulator and the LiDAR apparatus according an example embodiment has an improved reflectivity and change rate of refractive index, and thus, the phase modulation efficiency of light may be improved.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A light modulator comprising:

a first reflective layer;

a cavity layer provided on the first reflective layer; and a second reflective layer provided on the cavity layer opposite to the first reflective layer, the second reflective layer comprising a plurality of lattice structures, wherein each lattice structure of the plurality of lattice structures has a pin diode structure and comprises a p-type semiconductor layer, an intrinsic semiconductor layer, and an n-type semiconductor layer, wherein a thickness of the p-type semiconductor layer and a thickness the n-type semiconductor layer are in a range from 8% to 16% of a thickness of the intrinsic semiconductor layer, wherein the second reflective layer comprises a grating reflector that comprises the plurality of lattice structures spaced apart from each other, wherein a dielectric is included in spaces between the plurality of lattice structures, and wherein the n-type semiconductor layer is directly provided on the cavity layer.

2. The light modulator of claim 1, wherein a thickness of each lattice structure of the plurality of lattice structures is in a range from 500 nm to 700 nm.

3. The light modulator of claim 1, wherein a width of each lattice structure of the plurality of lattice structures is in a range from 300 nm to 400 nm.

4. The light modulator of claim 1, wherein the intrinsic semiconductor layer includes silicon.

5. The light modulator of claim 1, wherein the n-type semiconductor layer includes silicon that is doped with phosphorous or arsenic.

6. The light modulator of claim 1, wherein the p-type semiconductor layer includes silicon that is doped with boron.

7. The light modulator of claim 1, wherein a doping concentration of the p-type semiconductor layer and a doping concentration of the n-type semiconductor layer are in a range from $10^{15}$ $cm^{-3}$ to $10^{21}$ $cm^{-3}$.

8. The light modulator of claim 1, wherein a reflectivity of the second reflective layer is less than a reflectivity of the first reflective layer.

9. The light modulator of claim 1, wherein the first reflective layer is a distributed Bragg reflector.

10. A light modulator comprising:

a first reflective layer;

a cavity layer provided on the first reflective layer; and a second reflective layer provided on the cavity layer opposite to the first reflective layer, the second reflective layer, the second reflective layer comprising a plurality of lattice structures, wherein each lattice structure of the plurality of lattice structures has a pin diode structure and comprises a p-type semiconductor layer, an intrinsic semiconductor layer, and an n-type semiconductor layer, wherein a thickness of each lattice structure of the plurality of lattice structures is in a range from 500 nm to 700 nm, wherein a thickness of the p-type semiconductor layer and a thickness of the n-type semiconductor layer are in a range from 35 nm to 90 nm, wherein the second reflective layer comprises a grating reflector that comprises the plurality of lattice structures spaced apart from each other, wherein a dielectric is included in spaces between the plurality of lattice structures, and wherein the n-type semiconductor layer is directly provided on the cavity layer.

11. The light modulator of claim 10, wherein the thickness of the p-type semiconductor layer and the thickness of the n-type semiconductor layer range from 45 nm to 70 nm.

12. The light modulator of claim 10, wherein a width of each lattice structure of the plurality of lattice structures are in a range from 300 nm to 400 nm.

13. The light modulator of claim 10, wherein the intrinsic semiconductor layer includes silicon.

14. The light modulator of claim 10, wherein the n-type semiconductor layer includes silicon that is doped with phosphorous or arsenic.

15. The light modulator of claim 10, wherein the p-type semiconductor layer includes silicon that is doped with boron.

16. The light modulator of claim 10, wherein a doping concentration of the p-type semiconductor layer and a doping concentration of the n-type semiconductor layer are in a range from $10^{15}$ $cm^{-3}$ to $10^{21}$ $cm^{-3}$.

17. The light modulator of claim 10, wherein a reflectivity of the second reflective layer is less than a reflectivity of the first reflective layer.

18. A light detection and ranging (LiDAR) apparatus comprising:

a light source configured to emit light;

a light modulator configured to radiate light to an object based on controlling a traveling direction of the light emitted from the light source; and a photodetector configured to detect light reflected from the object, wherein the light modulator comprises:

a first reflective layer;

a cavity layer provided on the first reflective layer; and a second reflective layer provided on the cavity layer opposite to the first reflective layer, the second reflective layer comprising a plurality of lattice structures, wherein each lattice structure of the plurality of lattice structures has a pin diode structure and comprises a p-type semiconductor layer, an intrinsic semiconductor layer, and an n-type semiconductor layer, wherein a thickness of each lattice structure of the plurality of lattice structures is in a range from 500 nm to 700 nm, wherein a thickness of the p-type semiconductor layer and a thickness of the n-type semiconductor layer are in a range from 35 nm to 90 nm, wherein the second reflective layer comprises a grating reflector that comprises the plurality of lattice structures spaced apart from each other.

19. The LiDAR apparatus of claim 18, wherein a width of each lattice structure of the plurality of lattice structures is in a range from 300 nm to 400 nm.

20. The LiDAR apparatus of claim 18, wherein the intrinsic semiconductor layer includes silicon.

21. The LiDAR apparatus of claim 18, wherein the n-type semiconductor layer includes silicon that is doped with phosphorous or arsenide.

22. The LiDAR apparatus of claim 18, wherein the p-type semiconductor layer includes silicon that is doped with boron.

23. The LiDAR apparatus of claim 18, wherein a doping concentration of the p-type semiconductor layer and a doping concentration of the n-type semiconductor layer are in a range from $10^{15}$ $cm^{-3}$ to $10^{21}$ $cm^{-3}$.

24. The LiDAR apparatus of claim 18, wherein a reflectivity of the second reflective layer is less than a reflectivity of the first reflective layer.

25. The LiDAR apparatus of claim 18, wherein the second reflective layer includes a dielectric provided between the plurality of lattice structures.

26. The LiDAR apparatus of claim 18, wherein the first reflective layer is a distributed Bragg reflector.

27. A method of manufacturing a light modulator, the method comprising:

providing a first reflective layer;

providing a cavity layer on the first reflective layer; and providing a second reflective layer on the cavity layer, the second reflective layer comprising a plurality of lattice structures, wherein each lattice structure of the plurality of lattice structures has a pin diode structure and comprises a p-type semiconductor layer, an intrinsic semiconductor layer, and an n-type semiconductor layer, wherein a thickness of the p-type semiconductor layer and a thickness of the n-type semiconductor layer are in a range from 8% to 16% of a thickness of the intrinsic semiconductor layer, wherein the second reflective layer comprises a grating reflector that comprises the plurality of lattice structures spaced apart from each other, wherein a dielectric is included in spaces between the plurality of lattice structures, and wherein the n-type semiconductor layer is directly provided on the cavity layer.

* * * * *